(12) United States Patent
Zhang et al.

(10) Patent No.: US 9,324,480 B2
(45) Date of Patent: Apr. 26, 2016

(54) INTERFERENCE PREVENTION APPARATUS AND METHOD

(71) Applicant: Huawei Device Co., Ltd., Shenzhen (CN)

(72) Inventors: Lianming Zhang, Shenzhen (CN); Yue Liu, Xi'an (CN); Ke Ai, Shenzhen (CN)

(73) Assignee: Huawei Device Co., Ltd., Shenzhen (CN)

(*) Notice: Subject to any disclaimer, the term of this patent is extended or adjusted under 35 U.S.C. 154(b) by 17 days.

(21) Appl. No.: 14/539,795

(22) Filed: Nov. 12, 2014

(65) Prior Publication Data

US 2015/0162115 A1 Jun. 11, 2015

Related U.S. Application Data

(63) Continuation of application No. PCT/CN2013/088990, filed on Dec. 10, 2013.

(51) Int. Cl.
*H04B 3/28* (2006.01)
*H01B 11/18* (2006.01)
*H05K 9/00* (2006.01)

(52) U.S. Cl.
CPC ............ *H01B 11/18* (2013.01); *H05K 9/0098* (2013.01)

(58) Field of Classification Search
CPC ....... H01B 11/18; H05K 9/0098; H02H 9/005

USPC .......................................................... 333/12
See application file for complete search history.

(56) References Cited

U.S. PATENT DOCUMENTS

| | | | | |
|---|---|---|---|---|
| 5,287,008 A | * | 2/1994 | Pahr | H02H 9/005 |
| | | | | 307/89 |
| 2009/0231325 A1 | | 9/2009 | Suzuki et al. | |
| 2012/0200777 A1 | | 8/2012 | Ooga | |
| 2015/0366111 A1 | * | 12/2015 | Yagi | H02M 1/44 |
| | | | | 174/350 |

FOREIGN PATENT DOCUMENTS

| | | |
|---|---|---|
| CN | 2833655 Y | 11/2006 |
| CN | 101488330 A | 7/2009 |
| CN | 202425186 U | 9/2012 |
| CN | 203039674 U | 7/2013 |
| KR | 20090022052 A | 3/2009 |

* cited by examiner

*Primary Examiner* — Robert Pascal
*Assistant Examiner* — Kimberly Glenn
(74) *Attorney, Agent, or Firm* — Slater & Matsil, L.L.P.

(57) ABSTRACT

An interference prevention apparatus includes a control module configured to send a working signal to the interference prevention module. An interference prevention module is configured to receive the working signal and to control a working state of a first component. The first component is connected to the control module by a first connection wire. The first connection wire is divided into at least two segments by an interference prevention material, which is connected to ground.

16 Claims, 3 Drawing Sheets

INTERFERENCE PREVENTION APPARATUS AND METHOD

This application is a continuation of International Application PCT/CN2013/088990, filed on Dec. 10, 2013, which is hereby incorporated by reference in its entirety.

TECHNICAL FIELD

The present invention relates to the field of electronic technologies and, in particular embodiments, to an interference prevention apparatus and method.

BACKGROUND

Nowadays, an increasing number of electronic and electrical devices are integrated on an entire device. For example, an increasing number of electronic parts are integrated inside a car. In a narrow space environment, how the electronic and electrical devices can be compatible with each other, which means that no working fault or exception is caused to the electronic and electrical devices due to interference generated by running of other electronic and electrical devices and no fault or exception is caused to the other electronic and electrical devices due to interference of running of the electronic and electrical devices have been important problems that all automobile enterprises and relative providers need to confront.

To ensure quality of whole-machine products and proper running of electronic parts, all automobile enterprises set up their respective strict electromagnetic compatibility (EMC) standard specification to require their providers to provide electronic parts with a relatively low radiation interference level. For example, in a vehicle-mounted product, interference generated by a liquid crystal display (LCD) module group is relatively strong, which causes that a whole-machine product fails to satisfy an EMC index requirement of an automobile enterprise.

However, in the prior art, there is no interference prevention technology with a low cost and a good electromagnetic radiation interference prevention effect.

SUMMARY

Embodiments of the present invention provide an interference prevention apparatus and method, which can effectively reduce electromagnetic radiation interference generated in a circuit at a low cost.

According to a first aspect, an interference prevention apparatus includes an interference prevention module and a control module. The control module is configured to send a working signal to the interference prevention module. The interference prevention module is configured to receive the working signal and to control a working state of a first component according to the working signal. The first component is connected to the control module by using at least one first connection wire. The at least one first connection wire is divided into at least two segments by an interference prevention material. The interference prevention material is connected to ground. The interference prevention module is further configured to send a return current signal to the control module. The return current signal flows to the control module through the interference prevention material.

In a first possible implementation manner, the interference prevention apparatus further includes a connector connecting the interference prevention module and the control module. The connector is configured to receive the working signal, and send the working signal to the interference prevention module.

With reference to the first aspect or the first possible implementation manner of the first aspect, in a second possible implementation manner, the interference prevention material is an interference blocking material, the at least one first connection wire is wrapped by the interference prevention material, and a length of the interference prevention material is less than a length of the at least one first connection wire.

With reference to the second possible implementation manner of the first aspect, in a third possible implementation manner, the interference blocking material is copper foil, aluminum foil, silver foil, a conductive fabric, or a shielding coating.

With reference to the first aspect or the first possible implementation manner of the first aspect, in a fourth possible implementation manner, the interference prevention material is adhered to a set position of the at least one first connection wire.

With reference to the fourth possible implementation manner of the first aspect, in a fifth possible implementation manner, the interference prevention material is an electrically conductive double-sided adhesive tape.

According to a second aspect, an interference prevention method is provided. A working signal is sent by a control apparatus. A working state of a first component is controlled according to the working signal. The first component is connected to the control apparatus by using at least one first connection wire. The at least one first connection wire is divided into at least two segments by an interference prevention material. The interference prevention material is connected to ground. A return current signal is sent to the control apparatus. The return current signal flows to the control apparatus through the interference prevention material.

In the first possible implementation manner the working signal that is sent by the control apparatus through a connector.

With reference to the second aspect or the first possible implementation manner of the second aspect, in a second possible implementation manner, the interference prevention material is an interference blocking material, the at least one first connection wire is wrapped by the interference prevention material, and a length of the interference prevention material is less than a length of the at least one first connection wire.

With reference to the second possible implementation manner of the second aspect, in a third possible implementation manner, the interference blocking material is copper foil, aluminum foil, silver foil, a conductive fabric, or a shielding coating.

With reference to the second aspect or the first possible implementation manner of the second aspect, in a fourth possible implementation manner, the interference prevention material is adhered to a set position of the at least one first connection wire.

With reference to the fourth possible implementation manner of the second aspect, in a fifth possible implementation manner, the interference prevention material is an electrically conductive double-sided adhesive tape.

According to the technical solutions of the interference prevention apparatus and method provided in embodiments of the present invention, a connection wire between a control module and an interference prevention module is divided by using an interference prevention material, which reduces a loop area of a return current signal and can effectively reduce electromagnetic radiation interference generated in a circuit at a low cost.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
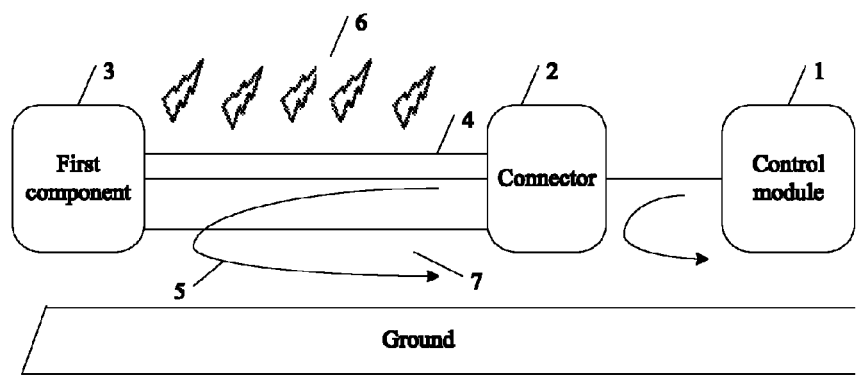
FIG. 1 is a schematic diagram of electromagnetic radiation interference generated in a circuit.

FIG. 1 is a schematic diagram of electromagnetic radiation interference generated in a circuit. In FIG. 1, a control module 1 is connected to a first component 3 by using a connector 2, and the control module 1 provides a control signal and a data signal for the first component 3, so as to control the first component 3 to work. For example, the first component 3 may be an LCD, and the control module 1 controls the LCD to perform display. In a general situation, because the connector 2 is relatively far away from the first component 3, electromagnetic radiation interference 6 generated by a return current signal 5 between the first component 3 and the connector 2 is great.

However, in the prior art, no processing is performed on electromagnetic radiation interference generated by a return current signal, there is larger external interference radiation space on a connection wire, and the return current signal searches for a path with lower impedance by itself to return to a source, that is, the control module 1, which causes failure in controlling a current return path and causes a larger area of a current return loop 7. Therefore, the electromagnetic radiation interference generated by the return current signal between the first component 3 and the connector 2 is great.

Generally, electromagnetic radiation includes differential-mode radiation and common-mode radiation.

The differential-mode radiation is analyzed by using a current loop model, and calculation formulas of radiated electromagnetic fields in a near field region and a far field region are as follows:

In the near field region:

$$H_1 = I_1 A_1 / (4\pi D_1^3)(A/m) \tag{1}$$

$$E_1 = Zo_1 I_1 A_1 / (2\lambda_1 D_1^2)(V/m) \tag{2}$$

In the far field region:

$$H_2 = \pi I_2 A_2 / (\lambda_2^2 D_2)(A/m) \tag{3}$$

$$E_2 = Zo_2 \pi I_2 A_2 / (\lambda_2^2 D_2)(V/m) \tag{4}$$

In formulas (1) to (4), I1 and I2 are loop currents; A1 and A2 are loop areas; D1 and D2 are distances from observation points to loops; Zo1 and Zo2 are impedance in free space; λ1 and λ2 are wavelengths corresponding to current frequencies; H1 and E1 are respectively a magnetic field strength and an electric field strength of the near field region of the differential-mode radiation; and H2 and E2 are respectively a magnetic field strength and an electric field strength of the far field region of the differential-mode radiation.

Similarly, the common-mode radiation is analyzed by using the current loop model, and calculation formulas of radiated electromagnetic fields in a near field region and a far field region are as follows:

In the near field region:

$$H_3 = I_3 L_3 / (4\pi D_3^2)(A/m) \tag{5}$$

$$E_3 = Zo_3 I_3 L_3 \lambda_3 / (8\lambda^2 D_3^3)(V/m) \tag{6}$$

In the far field region:

$$H_4 = I_4 L_2 / (2\lambda_4 D_4)(A/m) \tag{7}$$

$$E_4 = Zo_4 I_4 L_4 / (2\lambda_4 D_4)(V/m) \tag{8}$$

In formulas (5) to (8), $I_3$ and $I_4$ are loop currents; $L_3$ and $L_4$ are lengths of conducting wires; $D_3$ and $D_4$ are distances from observation points to loops; $Zo_3$ and $Zo_4$ are impedance in free space; $\lambda_3$ and $\lambda_4$ are wavelengths corresponding to current frequencies; $H_3$ and $E_3$ are respectively a magnetic field strength and an electric field strength of the near field region of the common-mode radiation; $H_4$ and $E_4$ are respectively a magnetic field strength and an electric field strength of the far field region of the common-mode radiation.

It can be known from the foregoing formulas (1) to (8) that, the differential-mode radiation of the near field region and the far field region may be reduced by reducing a loop current, a wavelength, or a loop area; and the common-mode radiation of the near field region and the far field region may also be reduced by reducing a loop current, a wavelength, or a length of a conducting wire. However, in practice, there are limitations on the two methods of reducing a loop current and a wavelength.

Figure 2:
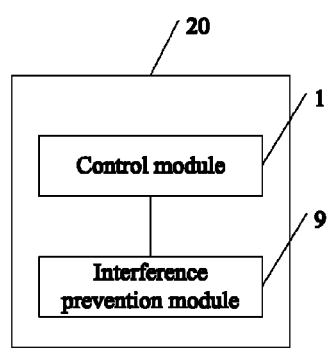
FIG. 2 is a structural diagram of an interference prevention apparatus according to an embodiment of the present invention.

Embodiments of the present invention provide an interference prevention apparatus and method. FIG. 2 is a structural diagram of an interference prevention apparatus according to an embodiment of the present invention. As shown in FIG. 2, an interference prevention apparatus 20 includes: a control module 1 and an interference prevention module 9.

The control module 1 is configured to send a working signal to the interference prevention module 9, where the working signal may be a control signal or a data signal or both.

The interference prevention module 9 is configured to receive the working signal, and control a working state of a first component 3 in the interference prevention module 9 according to the working signal, and the first component 3 and the control module 1 may be connected by using one or more connection wires 4. The interference prevention module 9 is further configured to send a return current signal to the control module 1.

Figure 3:
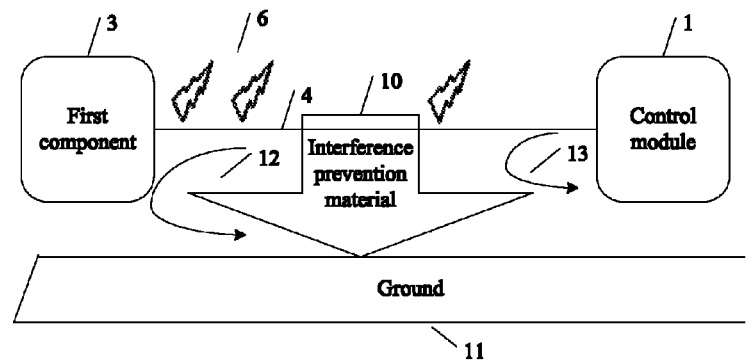
FIG. 3 is a schematic diagram of a principle of performing electromagnetic radiation interference prevention by an interference prevention apparatus according to an embodiment of the present invention.

FIG. 3 is a schematic diagram of a principle of performing electromagnetic radiation interference prevention by an interference prevention apparatus according to an embodiment of the present invention. A control module 1 sends a control signal or a data signal or both to an interference prevention module 9; the interference prevention module 9 receives the control signal or the data signal or both, and controls a working state of a first component 3. For example, according to the control signal, the interference prevention module 9 controls enabling or disabling of the first component 3, and controls output of the data signal on the first component 3, and so on.

In FIG. 3, the interference prevention module 9 includes the first component 3, a connection wire 4, and an interference prevention material 10, the connection wire 4 is divided into at least two segments by using the interference prevention material 10, and the interference prevention material 10 is connected to ground 11. A return current signal is shunted to two current return loops 12 and 13, and a return current signal in the current return loop 12 flows to the control module 1 through the interference prevention material 10 and the ground 11, and a return current signal in the current return loop 13 flows to the control module 1 through the ground 11. Compared with an area, in the prior art as shown in FIG. 1, of a current return loop 7 on which no interference prevention processing is performed, areas of the current return loops 12 and 13 in this embodiment are separately reduced, and according to the foregoing formulas, electromagnetic radiation interference generated by the return current signal is reduced.

Figure 4:
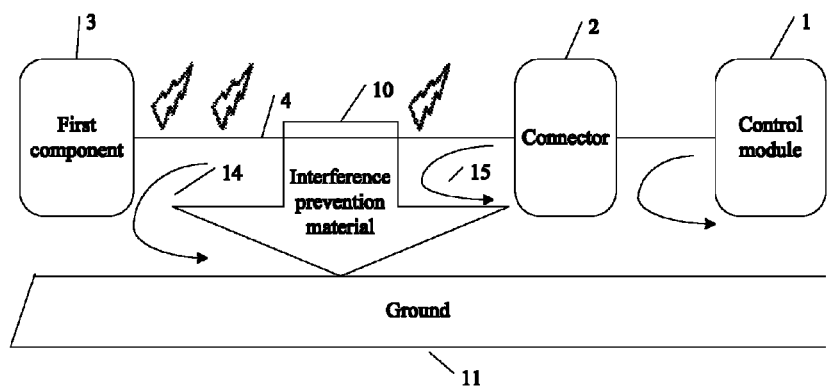
FIG. 4 is a schematic diagram of a principle of performing electromagnetic radiation interference prevention by an interference prevention apparatus according to another embodiment of the present invention.

FIG. 4 is a schematic diagram of a principle of performing electromagnetic radiation interference prevention by an interference prevention apparatus according to another embodiment of the present invention. As shown in FIG. 4, differences from FIG. 3 lie in that: a first component 3 in the interference prevention apparatus is connected to a control module 1 by using a connector 2, and the control module 1 sends a control signal or data signal or both to the first component 3 by using the connector 2; a connection wire 4 between the first component 3 and the connector 2 is divided into at least two segments by an interference prevention material 10, and the interference prevention material 10 is connected to ground 11; and a return current signal is shunted to at least two current return loops 14 and 15, and a return current signal in the current return loop 14 flows to the control module 1 through the interference prevention material 10 and the ground 11, and a return current signal in the current return loop 15 flows to the control module 1 through the ground 11. Compared with an area, in the prior art as shown in FIG. 1, of a current return loop 7 on which no interference prevention processing is performed, areas of the current return loops 14 and 15 in this embodiment are separately reduced, and according to the foregoing formulas, electromagnetic radiation interference generated by the return current signal is reduced.

Figure 5:
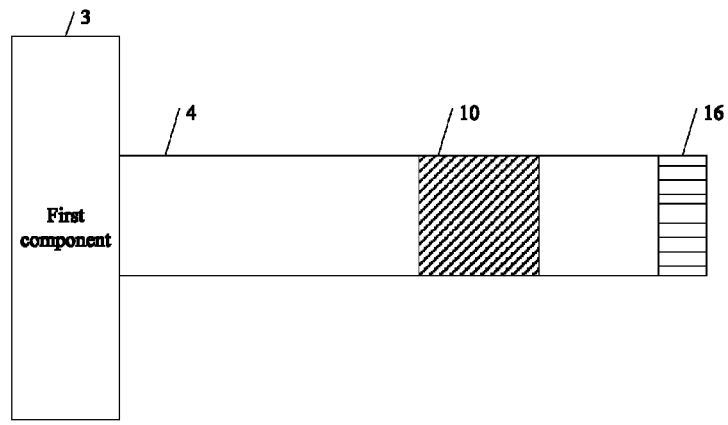
FIG. 5 is a schematic diagram of performing interference prevention processing on an interference prevention apparatus.

In another embodiment of the present invention, the interference prevention material may be an interference blocking material, and the interference blocking material is copper foil, aluminum foil, silver foil, a conductive fabric, and a shielding coating. As shown in FIG. 5, which is a schematic diagram of performing interference prevention processing on an interference prevention apparatus, one small segment or multiple small segments of all connection wires 4 are wrapped by an interference blocking material 10, where a length of the interference blocking material 10 is less than a length of the connection wires 4, and a first component 3 is inserted into the connector 2 shown in FIG. 4 by using a connection wire edge connector 16. In addition, the interference blocking material 10 is grounded. A connection wire is wrapped and divided by using an interference blocking material, which not only reduces an area of a current return loop so as to reduce electromagnetic radiation interference generated by a return current signal; in addition, the interference blocking material may also play a role of further reducing the electromagnetic radiation interference; and the interference blocking material only needs to wrap one small segment or multiple small segments of the connection wire, so interference prevention costs are low.

As another implementation manner, the interference prevention material may be an electrically conductive double-sided adhesive tape. For example, in FIG. 3 or FIG. 4, one side of the electrically conductive double-sided adhesive tape is adhered to a set position of all connection wires 4 that are bound together, and the other side is adhered to the ground 11, thereby dividing the connection wires 4, and the signal of the current return loop 12 or 14 flows to the control module 1 through the electrically conductive double-sided adhesive tape and the ground 11. Using the electrically conductive double-sided adhesive tape to prevent interference can effectively reduce the electromagnetic radiation interference, and in addition, operations are simple, and interference prevention costs are low.

It should be noted that the ground in the embodiment of the present invention should not be understood as limited to board ground, structural ground, or the like, but should be ground in a broad sense. A grounding manner is not limited to the implementation manner mentioned in this embodiment either.

Evidently, according to the interference prevention apparatus provided by the embodiment of the present invention, a connection wire between a control module and an interference prevention module is divided by using an interference prevention material, which reduces a loop area of a return current signal, and can effectively reduce electromagnetic radiation interference generated in a circuit at a low cost.

Figure 6:
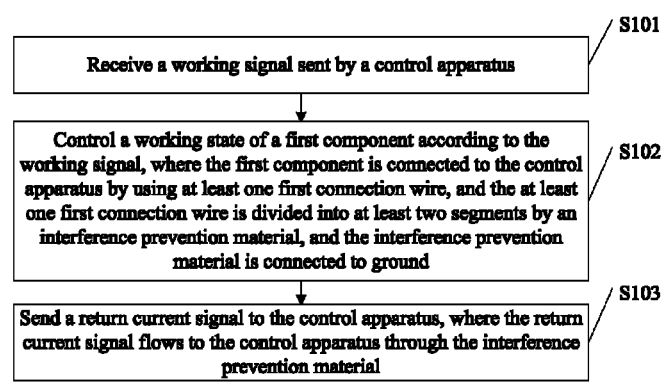
FIG. 6 is a flowchart of an interference prevention method according to an embodiment of the present invention.

Referring to FIG. 6, FIG. 6 is a method flowchart of an interference prevention method according to an embodiment of the present invention. The method includes the following steps.

Step S101: Receive a working signal sent by a control apparatus.

In electrical and electronic devices, generally, there are one or multiple control apparatuses that control working of each component, and these components are connected to the control apparatus by using connection wires. Because the control apparatus is generally relatively far away from these components, there is larger external interference radiation space on the connection wires, and a return current signal searches for a path with lower impedance by itself to return to a source, that is, the control apparatus, which causes failure in controlling a current return path and causes a larger area of a current return loop. Therefore, electromagnetic radiation interference generated by return current signals between these components and the control apparatus is great.

In this embodiment of the present invention, the working signal sent by the control apparatus is received, and the working signal may be a control signal or a data signal or both.

Step S102: Control a working state of a first component according to the working signal, where the first component is connected to the control apparatus by using at least one first connection wire, and the at least one first connection wire is divided into at least two segments by an interference prevention material, and the interference prevention material is connected to ground.

A working state of a working component is controlled according to the received working signal. For example, according to the control signal, enabling or disabling of the first component is controlled, and output of the data signal on the first component is controlled. The working component and the control apparatus are connected by using one or more connection wires, the connection wire is divided into at least two segments by using the interference prevention material; the interference prevention material is connected to the ground.

Step S103: Send a return current signal to the control apparatus, where the return current signal flows to the control apparatus through the interference prevention material.

The return current signal is sent to the control apparatus, and the return current signal is shunted to at least two current return loops by the interference prevention material, and a return current signal in a current return loop flows to the control apparatus through the interference prevention material and the ground.

Compared with an area, in the prior art as shown in FIG. 1, of a current return loop 7 on which no interference prevention processing is performed, areas of the current return loops in this embodiment are separately reduced, and according to the foregoing formulas, electromagnetic radiation interference generated by the return current signal is reduced.

Further, the working component may also be connected to the control apparatus by using a connector. In this case, step S101 would be implemented by having the working signal that is sent by the control apparatus received using the connector.

As an implementation manner, the interference prevention material may be an interference blocking material, and the interference blocking material is copper foil, aluminum foil, silver foil, a conductive fabric, or a shielding coating. As shown in FIG. 5, which is a schematic diagram of performing interference prevention processing on an interference prevention apparatus, one small segment or multiple small segments of all connection wires 4 are wrapped by an interference blocking material 10, where a length of the interference blocking material 10 is less than a length of the connection wires 4, and a first component 3 is inserted into the connector 2 shown in FIG. 4 by using a connection wire edge connector 16. In addition, the interference blocking material 10 is grounded. A connection wire is wrapped and divided by using an interference blocking material, which not only reduces an area of a current return loop so as to reduce electromagnetic radiation interference generated by a return current signal; in addition, the interference blocking material may also play a role of further reducing the electromagnetic radiation interference; and the interference blocking material only needs to wrap one small segment or multiple small segments of the connection wire, so interference prevention costs are low.

As another implementation manner, the interference prevention material may be an electrically conductive double-sided adhesive tape. For example, in FIG. 3 or FIG. 4, one side of the electrically conductive double-sided adhesive tape is adhered to a set position of all connection wires 4 that are bound together, and the other side is adhered to the ground 11, thereby dividing the connection wires 4, and the signal of the current return loop 12 or 14 flows to the control module 1 through the electrically conductive double-sided adhesive tape and the ground 11. Using the electrically conductive double-sided adhesive tape to prevent interference can effectively reduce the electromagnetic radiation interference, and in addition, operations are simple, and interference prevention costs are low.

It should be noted that the ground in the embodiment of the present invention should not be understood as limited to board ground, structural ground, or the like, but should be ground in a broad sense. A grounding manner is not limited to the implementation manner mentioned in this embodiment either.

Evidently, according to the interference prevention method provided by this embodiment of the present invention, a connection wire between a control module and an interference prevention module is divided by using an interference prevention material, which reduces a loop area of a return current signal, and can effectively reduce electromagnetic radiation interference generated in a circuit at a low cost.

It should be noted that, for ease of description, the foregoing method embodiments are described as a series of action combinations. However, a person skilled in the art should understand that the present invention is not limited to the described sequence of the actions, because some steps may be performed in another sequence or performed at the same time according to the present invention. In addition, a person skilled in the art should also understand that the embodiments described in this specification all belong to exemplary embodiments, and the involved actions and modules are not necessarily mandatory to the present invention.

In the foregoing embodiments, the description of each embodiment has respective focuses. For a part that is not described in detail in an embodiment, reference may be made to related descriptions in other embodiments.

In summary, what is described above is merely exemplary embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:

1. An interference prevention apparatus, comprising:
   an interference prevention module; and
   a control module, configured to send a working signal to the interference prevention module;
   wherein the interference prevention module is configured to receive the working signal and to control a working state of a first component according to the working signal, wherein the first component is connected to the control module by using a first connection wire, the first connection wire is divided into at least two segments by an interference prevention material, and the interference prevention material is connected to ground; and
   wherein the interference prevention module is further configured to send a return current signal to the control module, wherein the return current signal flows to the control module through the interference prevention material.

2. The interference prevention apparatus according to claim 1, further comprising a connector connecting the interference prevention module and the control module, wherein the connector is configured to receive the working signal and to send the working signal to the interference prevention module.

3. The interference prevention apparatus according to claim 1, wherein the interference prevention material comprises an interference blocking material.

4. The interference prevention apparatus according to claim 3, wherein the interference prevention material is wrapped around the first connection wire and a length of the interference prevention material is less than a length of the first connection wire.

5. The interference prevention apparatus according to claim 3, wherein the interference blocking material comprises a metallic foil.

6. The interference prevention apparatus according to claim 5, wherein the interference blocking material is copper foil, aluminum foil, or a silver foil, a conductive fabric, or a shielding coating.

7. The interference prevention apparatus according to claim 3, wherein the interference blocking material is a conductive fabric.

8. The interference prevention apparatus according to claim 3, wherein the interference blocking material is a shielding coating.

9. The interference prevention apparatus according to claim 1, wherein the interference prevention material is adhered to a set position of the first connection wire.

10. The interference prevention apparatus according to claim 9, wherein the interference prevention material is an electrically conductive double-sided adhesive tape.

11. An interference prevention method, comprising:
receiving a working signal sent by a control apparatus;
controlling a working state of a first component according to the working signal, wherein the first component is connected to the control apparatus by a first connection wire, the first connection wire is divided into a plurality of segments by an interference prevention material, and the interference prevention material is connected to ground; and
sending a return current signal to the control apparatus, wherein the return current signal flows to the control apparatus through the interference prevention material.

12. The interference prevention method according to claim 11, wherein receiving the working signal comprises receiving the working signal that is sent by the control apparatus through a connector.

13. The interference prevention method according to claim 11, wherein the interference prevention material comprises an interference blocking material, the first connection wire is wrapped by the interference prevention material, and a length of the interference prevention material is less than a length of the first connection wire.

14. The interference prevention method according to claim 13, wherein the interference blocking material is copper foil, aluminum foil, silver foil, a conductive fabric, or a shielding coating.

15. The interference prevention method according to claim 11, wherein the interference prevention material is adhered to a set position of the first connection wire.

16. The interference prevention method according to claim 15, wherein the interference prevention material is an electrically conductive double-sided adhesive tape.

* * * * *